United States Patent
Gibson et al.

(10) Patent No.: US 8,405,464 B2
(45) Date of Patent: Mar. 26, 2013

(54) ELECTRONIC DEVICE FOR CONTROLLING A FREQUENCY MODULATION INDEX AND A METHOD OF FREQUENCY-MODULATING

(75) Inventors: Neil Gibson, Freising (DE); Michael Couleur, Poules-les-Echarmeaux (FR)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/010,396

(22) Filed: Jan. 20, 2011

(65) Prior Publication Data

US 2011/0175683 A1 Jul. 21, 2011

(30) Foreign Application Priority Data

Jan. 21, 2010 (DE) .................... 10 2010 005 276

(51) Int. Cl.
*H03B 29/00* (2006.01)
*H03C 3/00* (2006.01)
(52) U.S. Cl. .................................. 331/78; 332/117
(58) Field of Classification Search .............. 331/78, 331/177 R, 178, 47, 111, 143, 57; 332/117; 323/271, 282, 284, 283, 288, 225; 327/156
See application file for complete search history.

(56) References Cited

U.S. PATENT DOCUMENTS

| | | | |
|---|---|---|---|
| 2002/0145478 A1* | 10/2002 | Chang | 331/78 |
| 2005/0013343 A1 | 1/2005 | Giunco et al. | |
| 2007/0236188 A1* | 10/2007 | Gibson et al. | 323/225 |
| 2009/0102445 A1 | 4/2009 | Ito et al. | |
| 2009/0224684 A1 | 9/2009 | Moskowitz et al. | |
| 2009/0322299 A1 | 12/2009 | Michishita et al. | |
| 2010/0090775 A1* | 4/2010 | Huda et al. | 332/117 |
| 2010/0214031 A1* | 8/2010 | Yamamoto et al. | 331/34 |
| 2011/0026083 A1* | 2/2011 | Nakazawa | 358/401 |

FOREIGN PATENT DOCUMENTS

| | | |
|---|---|---|
| JP | 01277371 | 7/1989 |
| KR | 1020000056675 | 9/2000 |
| WO | WO 2009057289 A1 * | 5/2009 |

OTHER PUBLICATIONS

PCT Search Report mailed Sep. 28, 2011.

* cited by examiner

*Primary Examiner* — Ryan Johnson
(74) *Attorney, Agent, or Firm* — William B. Kempler; Wade J. Brady III; Frederick J. Telecky, Jr.

(57) ABSTRACT

An electronic device controlling a frequency modulation index has a frequency modulation index control loop having an input adapted to be connected to a frequency output of a frequency controllable oscillator. The oscillator has a center frequency $F_c$ and an output adapted to be connected to an input of a frequency-modulation unit, the modulation index control loop being adapted to determine the modulation index. Further provided is a method of frequency-modulating with a modulation frequency $F_m$ a non-linear controllable oscillator having a center frequency $F_c$ with a constant modulation index.

12 Claims, 3 Drawing Sheets

ELECTRONIC DEVICE FOR CONTROLLING A FREQUENCY MODULATION INDEX AND A METHOD OF FREQUENCY-MODULATING

This patent application claims priority from German Patent Application No. 10 2010 005 276.0, filed Jan. 21, 2010, which is incorporated herein by reference in its entirety.

FIELD OF THE INVENTION

The invention relates to an electronic device for controlling a frequency modulation index and to a method of frequency-modulating a non-linear controllable oscillator with a modulation frequency $F_m$.

BACKGROUND OF THE INVENTION

It is well-known in the arts to frequency-modulate oscillators. Switched DC-DC converters are also well known, in which for example transistors are switched with a switching frequency, wherein the switching frequency is generated by an oscillator. Especially when the switching frequency is high, this leads to noise and undesired electromagnetic interferences (EMI).

For a variety of reasons high-frequency conversion systems generate more noise than their low-frequency counterparts.

More recently it became therefore necessary to frequency-modulate oscillators used in switched DC-DC converters. In this case a so-called spread-spectrum function is used to keep noise levels of the converter down. The DC-DC converter is not switched anymore with a fixed frequency, but the switching frequency is varied around a center frequency to get a frequency spectrum which is spread, thus the energy is not concentrated to only one frequency.

One known parameter of frequency modulation is the modulation index or modulation ratio which is defined as the ratio between the maximal difference or deviation of the modulated frequency to the center frequency. The modulation index thus indicates how much the modulated frequency varies around the center frequency. The modulation index can be expressed by formula (1):

$$M_I = \frac{\Delta F}{F_c} \quad (1)$$

wherein $M_I$ is the modulation index with $0 \leq M_I \leq 1$
$\Delta F$ is the maximal difference between the modulated frequency and the center frequency
$F_c$ is the center frequency.

For a given frequency modulation it is important that the modulation index is kept constant. In conversion systems which employ fixed-frequency oscillators, a spread spectrum can easily be accomplished by using a linear ramp generator with a specific magnitude as a modulating signal to get the desired modulation index. To keep the modulation index constant the maximum amplitude of the linear ramp generator is kept constant by means of current or voltage control.

In HF conversion systems, hysteretic/ring-oscillating regulation methods are often employed.

DC-DC converters or oscillators employing hysteretic/ring oscillating methods have a frequency which is inherently variable and therefore difficult to predict. There are methods to lock the operating frequency of these converters to a given frequency. However, the frequency gain of the resulting system is highly variable, non-linear and dependent on external conditions. It is for example dependent on the voltage levels at the input and at the output and it depends on the equivilant series inductance of the output capacitor in a DC-DC converter (ESL). These oscillators have a non-linear control behavior.

Thus, the magnitude of the modulation signal required to achieve a given modulation index is highly variable and keeping the modulating current to a specified value does not necessarily keep the modulation index constant.

SUMMARY OF THE INVENTION

It is a general object of the invention to provide an electronic device for controlling a frequency modulation index. Controlling will allow a controllable oscillator to be frequency-modulated with a constant modulation index, even if its control behavior is non-linear.

It is another object of the invention to provide a method of frequency-modulating with a modulation frequency a non-linear controllable oscillator having a center frequency $F_c$ with a constant modulation index.

Accordingly, in an aspect of the invention, an electronic device is provided which comprises a frequency modulation index control loop. The control loop has an input which is adapted to be connected to a frequency output of a frequency controllable oscillator with a center frequency $F_c$. The control loop has an output adapted to be connected to an input of a frequency-modulation unit, the modulation index control loop being adapted to determine the modulation index.

In an aspect of the invention, the frequency modulation index control loop is adapted to measure the modulated frequency which is output from the controllable oscillator. The controllable oscillator can be a ring oscillator or any other kind of oscillator. The invention may also be applied to a self-oscillating DC-DC converter. The modulated frequency may be measured by different known means.

In an embodiment, the oscillator may be a self-oscillating DC-DC buck converter with zero hysteresis. The converter may then comprise a comparator with a supply input, a non-inverting input to which a reference voltage can be applied, an inverting input to which a feedback signal can be applied and an output to which a filter network can be connected. The feedback signal may be derived from the filter network and the output voltage of the converter may be determined by the reference voltage. In an embodiment, the comparator may be used as a single inverter pseudo ring oscillator. The high gain of the comparator ensures oscillation at a period which is twice the propagation delay of the comparator. When the output of the comparator is looped back to the inverting input, the result is a rectangular waveform at the output of the comparator. The voltage applied to the non-inverting input of the comparator has no influence on the comparator's output signal. However, connecting a filter network with an inductor and a capacitor to the output of the comparator and deriving the feedback signal from the filter network, may be advantageous. This may result in an output of the comparator which is a DC output with a superimposed ripple. The level of the DC output may be controlled by the reference voltage applied to the non-inverting input of the comparator, and the ripple voltage developed by the inductor current flowing in the equivalent series resistance of the load circuit connected to the comparator output. The ripple can be regarded as the ramp signal in a conventional DC-DC converter. Accordingly, with the supply input to the comparator and the output voltage of the comparator regulated to follow the reference voltage, the proposed topology can be equivalent to a DC-DC buck converter. It should be understood that for convenience, the comparator as defined here may have a low impedance output, and that practical implementations require a power stage conventionally comprising a gate driver and a pair of complementary power transistors.

In an embodiment, the filter network may include an output inductor with a first terminal connected to the output of the comparator and a second terminal connected to an output capacitor. The feedback signal may then be taken at the interconnection node of the output inductor and the output capacitor.

The oscillating frequency may then be determined by the propagation delay of the comparator and the phase shift (time delay) of the SW signal (output of comparator) through the filter network to the comparator's inverting input. In an embodiment, the propagation delay of the converter may be controlled by adjusting the bias current of the comparator in order to steer the oscillating frequency. The oscillating frequency may advantageously be steered with the control loop according to aspects of the invention. A bias current of the comparator (thus varying the comparator's propagation delay) may be varied so as to adjust and vary the operating frequency.

The converter as described may have an "auto-generated ramp", which is the inductor current ripple multiplied by the equivalent series resistance (ESR) in the load circuit. As long as the magnitude of this ramp is greater than the magnitude of signals fed back into the output of the converter resulting from board generated resonances, the frequency control is continuous. However, if the parasitic resonances are in the region of the converter's operating frequency, the frequency lock may not be stable.

In a further embodiment, the range of stable frequency control may be enlarged in that the comparator has a pair of complementary auxiliary inputs each connected with one of two different filter circuits connected to the output of the comparator. The filter circuits may then each comprise a resistor connected in series with a capacitor between the output of the comparator and a reference terminal. In this embodiment, the comparator internally generates a ramp and sums this with the standard fast feedback signal.

The modulation index may then be calculated by integrating over time the absolute value of deviation of the measured modulated frequency signal from the center frequency.

With reference to FIG. 1, the calculation of the modulation index will now be explained. A line 10 in FIG. 1 shows a possible modulated frequency output over time of the oscillator. A broken line 12 indicates the center frequency of the oscillator. By way of an example, the modulated frequency output varies in the form of a triangular signal. But other variations are possible, for example a sinusoidal signal. The greatest difference or deviation of the modulated frequency from the center frequency is $\Delta F$. The modulation frequency is $F_m$, and the modulation time period $T_m$ is indicated.

An integration over time of the absolute value of deviation from the center frequency is as way of example effectuated by time sections of a quarter of the modulation time period $T_m$. For the first quarter of time period $T_m$ the actual frequency output is given to $$F(t) = F_c + \frac{\Delta F \cdot 4}{T_m} \cdot t \tag{2}$$

An integration over time gives $$\int_0^{\frac{T_m}{4}} F(t) \cdot dt = \int_0^{\frac{T_m}{4}} \left( F_c + \frac{4}{T_m} \cdot \Delta F \cdot t \right) dt \tag{3}$$

$$= \left[ F_c \cdot t + \frac{4}{T_m} \cdot \Delta F \cdot \frac{1}{2} \cdot t^2 \frac{T_m}{4} \right]_0^{\frac{T_m}{4}} \tag{4}$$

$$= \frac{F_c \cdot T_m}{4} + \frac{4}{T_m} \cdot \Delta F \cdot \frac{1}{2} \cdot \frac{T_m^2}{16} \tag{5}$$

$$= \frac{F_c \cdot T_m}{4} + \frac{\Delta F}{8} \cdot T_m \tag{6}$$

Integrating over the second quarter of the modulation time period $T_m$ and adding this to the result for the first quarter, we get for the first half of the modulation time period $T_m$ $$\frac{F_c \cdot T_m}{2} + \frac{\Delta F \cdot T_m}{4} \tag{7}$$

For the second half of a time period $T_m$ the result is $$\frac{F_c \cdot T_m}{2} - \frac{\Delta F \cdot T_m}{4} \tag{8}$$

Then, the absolute value of the deviation from the center frequency over a full modulation time period $T_m$ is given by $$R = \frac{\Delta F \cdot T_m}{2} \tag{9}$$

In fact, this corresponds to the hatched area in FIG. 1. With the modulation index being defined by $$\frac{\Delta F}{F_c},$$

it is possible to express a modulation index by the calculated R when the modulation time period $T_m$ and the center frequency $F_c$ of the oscillator are known:

$$M_I \frac{\Delta F}{F_c} = \frac{2R}{T_m \cdot F_c} \tag{10}$$

Thus, the integration over time of the absolute value of deviation from the center frequency of the measured modulated frequency signal allows the actual modulation index to be calculated.

In an embodiment of the invention, the electronic device further comprises the frequency-modulation unit adapted to output a modulation signal to the controllable oscillator to frequency-modulate the oscillator center frequency $F_c$ with a modulating frequency $F_m$ such that during a first half of the modulating time period $T_m$ the oscillator frequency is higher than the center frequency $F_c$ and during a second half of the modulating time period $T_m$ the oscillator frequency is lower than the center frequency $F_c$. The frequency modulation index control loop further comprises an integrating unit with an input adapted to be connected to an output of the controllable oscillator and adapted to calculate a difference between an integration of the modulated oscillator frequency over time during the first half of the modulating time period $T_m$ and an integration of the modulated oscillator frequency over time during the second half of the modulating time period $T_m$. The frequency modulation index control loop further comprises a comparator unit coupled to an output of the integrating unit and adapted to compare the calculated difference with an expected difference and to adjust the modulation signal output from the frequency modulating unit accordingly to match the calculated difference with the expected difference.

According to this embodiment, the modulated oscillator frequency is higher than the center frequency in a first half of the modulating time period and in the second half of a modulating time period the oscillator frequency is lower than the center frequency. This facilitates integration. Thus, if integrating over time there will always be a difference between the integration during the first half of the modulating time period and the integration during the second half of the modulating time period as already shown above mathematically. By subtracting the two integration results for the first and the second half of the modulating time period respectively, the integration over time of the absolute value of deviation from the center frequency is easily obtained.

In a further aspect of the invention the frequency-modulating unit is a triangular signal generator outputting a triangular signal with a controllable amplitude which is adjustable by the comparator signal. When the amplitude is increased, the maximal deviation of the modulated frequency from the center frequency is increased as well.

In a further aspect of the invention the integrating unit is an up-down counter coupled to count up the periods of the modulated frequency during the first half of the modulating time period $T_m$ and to count down the periods of the modulated frequency during the second half of the modulating time period. This is a very simple realization of the integrating unit. As in the first half of the modulating time period the modulating frequency $F_m$ will be higher than the center frequency and in the second half of a modulating time period the oscillator frequency will be lower than the center frequency, the up-down counter will always come to a difference when counting over a full modulating time period $T_m$. Preferably, in this embodiment the up-down counter is reset at each beginning of a modulating time period $T_m$ and outputs to the comparator unit the actual count at each end of a modulating time period.

In an aspect of the invention, the comparator unit is a digital comparator adapted to output a first signal, when the calculated difference is smaller than the expected difference, a second signal when the calculated difference is equal to the expected difference, and a third signal when the calculated difference is greater than the expected difference. The three different signals lead to an increase, no change or a decrease respectively of the controllable amplitude of the frequency-modulating unit. In a further embodiment of the invention it is also possible that the integrating unit is an analog integrator and it is possible that the comparator unit is an analog comparator. The invention further provides a method of frequency-modulating with a modulation frequency $F_m$ a non-linear controllable oscillator having a center frequency $F_c$ with a constant modulation index. The method comprises to provide a triangular ramp generator signal with a variable amplitude and to frequency-modulate the non-linear controllable oscillator using the triangular ramp generator signal such that during a first half of the modulating time period $T_m$ the oscillator frequency is higher than the center frequency and in a second half of the modulating time period the oscillator frequency is lower than the center frequency. The method further comprises measuring the modulated oscillator frequency which is output from the controllable oscillator. In a further step, the measured modulated oscillator frequency is integrated over time during the first half of the modulating time period and integrated over time during the second half of the modulating time period. A difference is calculated between the result obtained during the first half of the modulating time period and the result obtained during the second half of the modulating time period. This is for example easily achieved by using an up-down counter. The calculated difference is then compared with an expected difference. The expected difference is defined by the desired modulation index, the modulation time period and the center frequency. In a further step of the inventive method the amplitude of the triangular ramp generator signal which is output from the frequency-modulating unit is adjusted accordingly to match the calculated difference with the expected difference. Thus, the modulation index can be kept constant.

BRIEF DESCRIPTION OF DRAWINGS

Further aspects of the invention will ensue from the description herein below of preferred embodiments of the invention with reference to the accompanying drawings, wherein.

DESCRIPTION OF THE EMBODIMENTS

Figure 2:
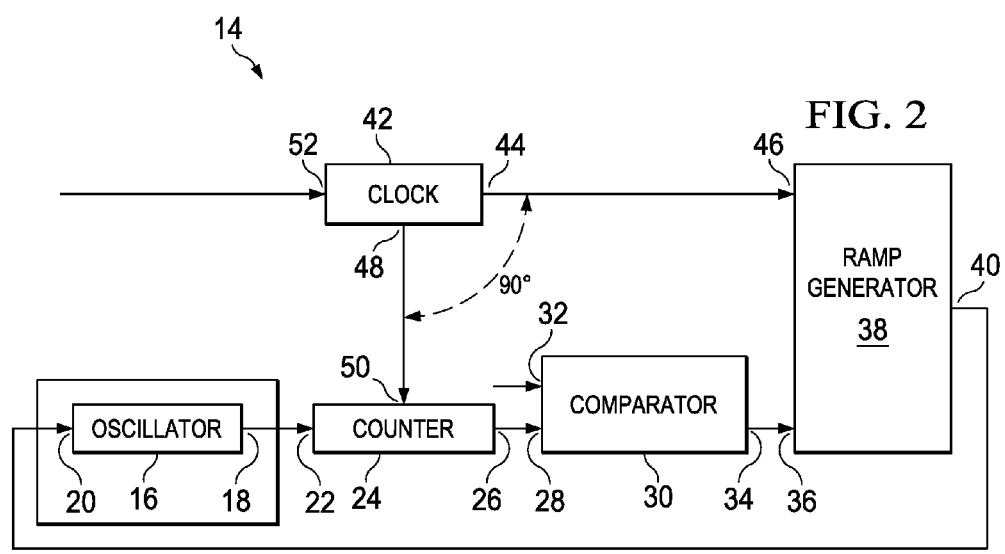
FIG. 2 is a block diagram showing an oscillating system comprising an inventive electronic device.

FIG. 2 shows schematically an oscillating system 14. An oscillator 16 has a frequency output 18 where the oscillator frequency is output. Oscillator 16 is a controllable oscillator further comprising a modulation signal input 20 adapted to receive a modulation signal. Frequency output 18 is connected to an input 22 of a digital up-down counter 24 comprising a count output 26 adapted to output a count result. Count output 26 is connected to a comparator input 28 of a comparator 30.

Comparator 30 comprises a second input 32 adapted to input a target count. Comparator 30 comprises a comparator output 34 adapted to output a signal representing the result of a comparison between the count output from counter 24 and the target count. Comparator output 34 is connected to a control input 36 of a ramp generator 38. Control input 36 is adapted to receive a control signal for controlling the amplitude of the ramp signal. Ramp generator 38 further comprises a signal output 40 where the ramp signal generated by ramp generator 38 is output. Generator signal output 40 is connected to the modulation control input 20 of oscillator 16. The ramp generated by the ramp generator is the modulation signal.

Oscillating system 14 further comprises a clock unit 42 with a first clock output 44 which is connected to a clock input 46 of ramp generator 38 and a second output 48 connected to a clock input 50 of counter 24. Clock unit 42 receives a system clock at an input 52.

Figure 3:
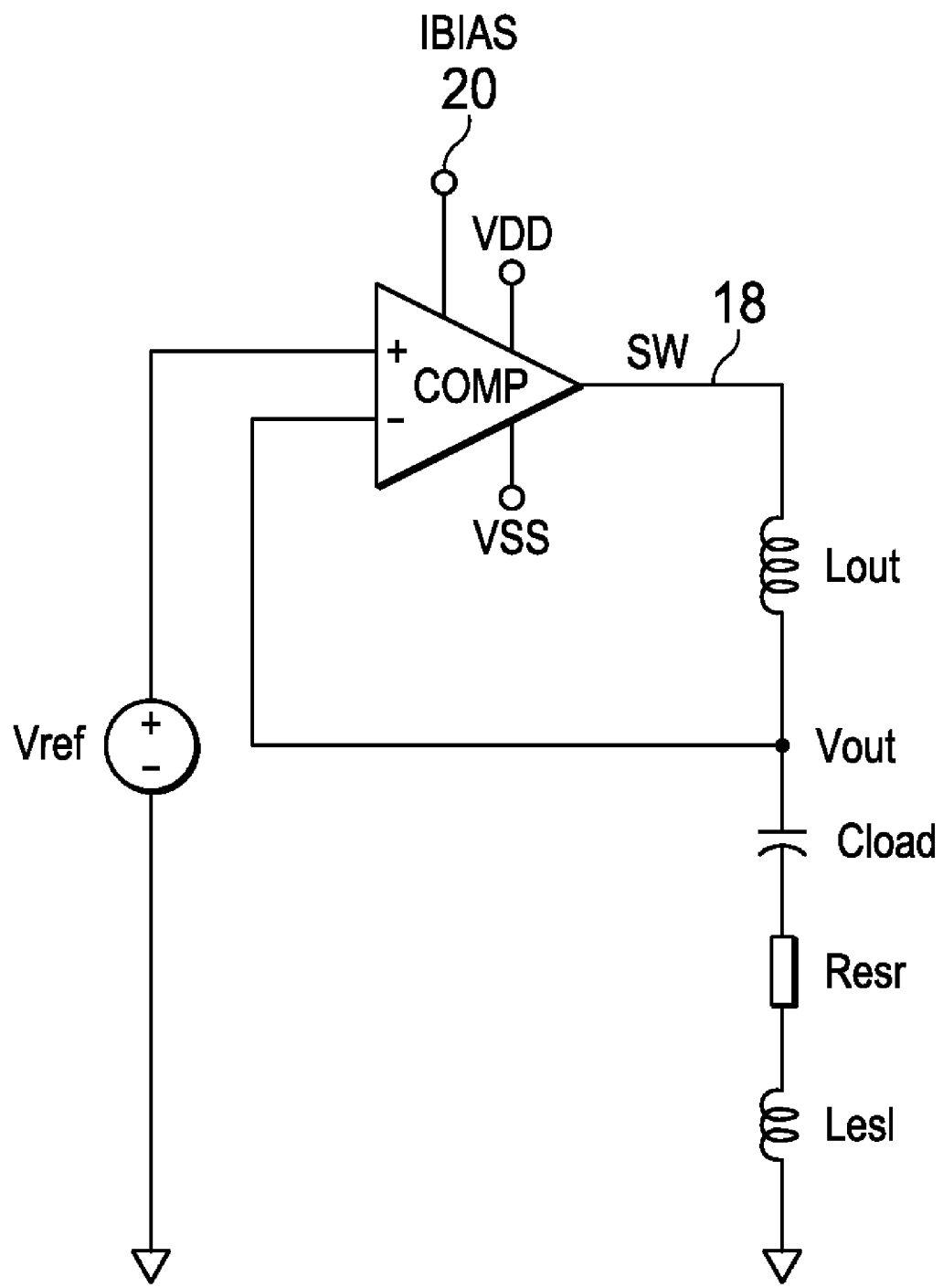
FIG. 3 is a simplified circuit diagram showing a oscillator according to an embodiment of the invention.

Oscillator 16 may be an oscillator of hysteretic/ring oscillator-type architecture with a center frequency $F_c$. In an advantageous embodiment, the oscillator may be implemented as shown in FIG. 3. The oscillating frequency of a ring oscillator can be varied by changing the propagation delay of the gates used to build the ring oscillator. The modulation signal which is input at input 20 may be a bias current thus varying the propagation delay of the ring oscillator. For the oscillator shown in FIG. 3 signal 20 may also be a bias current. This will be explained in more detail with respect to FIG. 3.

Counter 24 as an integrating unit and comparator 30 form together a frequency modulation index control loop, whereas ramp generator 38 is a frequency-modulation unit.

The signal at input 52 may be a periodic clock signal with a frequency of several MHz, for example 6 MHz. The signals generated at outputs 48 and 44 may be periodic clock signals with a lower frequency, for example 100 kHz. The ramp generator 38 may be multiplying digital-to-analog converter.

FIG. 3 shows a simplified circuit diagram of self-oscillating DC-DC converter which can be used as the oscillator 16 shown in FIG. 2. COMP is a high gain comparator with a pair of complementary inputs and an output. A reference voltage source Vref is connected to the non-inverting input of the comparator. A filter network mainly comprising an output inductor Lout and a load capacitor Cload is connected to the output of comparator COMP. Lout and Cload are shown in series with an equivalent series resistance Resr and an equivalent series inductance Lesl, as usual. The interconnection node of Load and Cload is connected to the inverting input of comparator COMP and at the same time is the voltage output Vout of the circuit. Comparator COMP has a power supply VDD and VSS, as usual.

Due to the high gain of comparator COMP, to the propagation delay of the comparator and to the delay introduced by the filter network, the oscillating condition of the configuration shown in FIG. 3 is satisfied at a fixed frequency which, in a typical implementation, can be several MHz.

The oscillating frequency of the self-oscillating DC-DC converter can be adjusted with the bias current IBIAS of the comparator COMP. Signal 20 of FIG. 2 may therefore be coupled so as to control the bias current IBIAS. The output SW of the comparator may be coupled counter 24 so as to determine the oscillating frequency and the variations in accordance with the invention.

The signal at the output of the comparator COMP, is referred to as the switch node SW. The signal at node SW may have a rectangular waveform. The voltage swing may substantially be rail-to-rail. In the example shown, the reference voltage is assumed to, for example 2.80 V. The output voltage Vout may then be at the level of the reference voltage with a superimposed ripple. Although the ripple is very small, by being applied to the inverting input of comparator COMP, it acts as a ramp signal similar to a conventional converter, thereby regulating the level of the output voltage Vout. In the context of this invention, the ramp signal is referred to as an "auto-generated ramp" to distinguished from a ramp signal generated by a separate ramp signal generator. The magnitude of the "auto-generated ramp" is the ripple current multiplied by the equivalent series resistance Resr.

In an application where the oscillating frequency must be controlled, advantage is taken of the fact that the propagation delay of the comparator can be controlled by adjusting the bias current supplied to the comparator.

Figure 4:
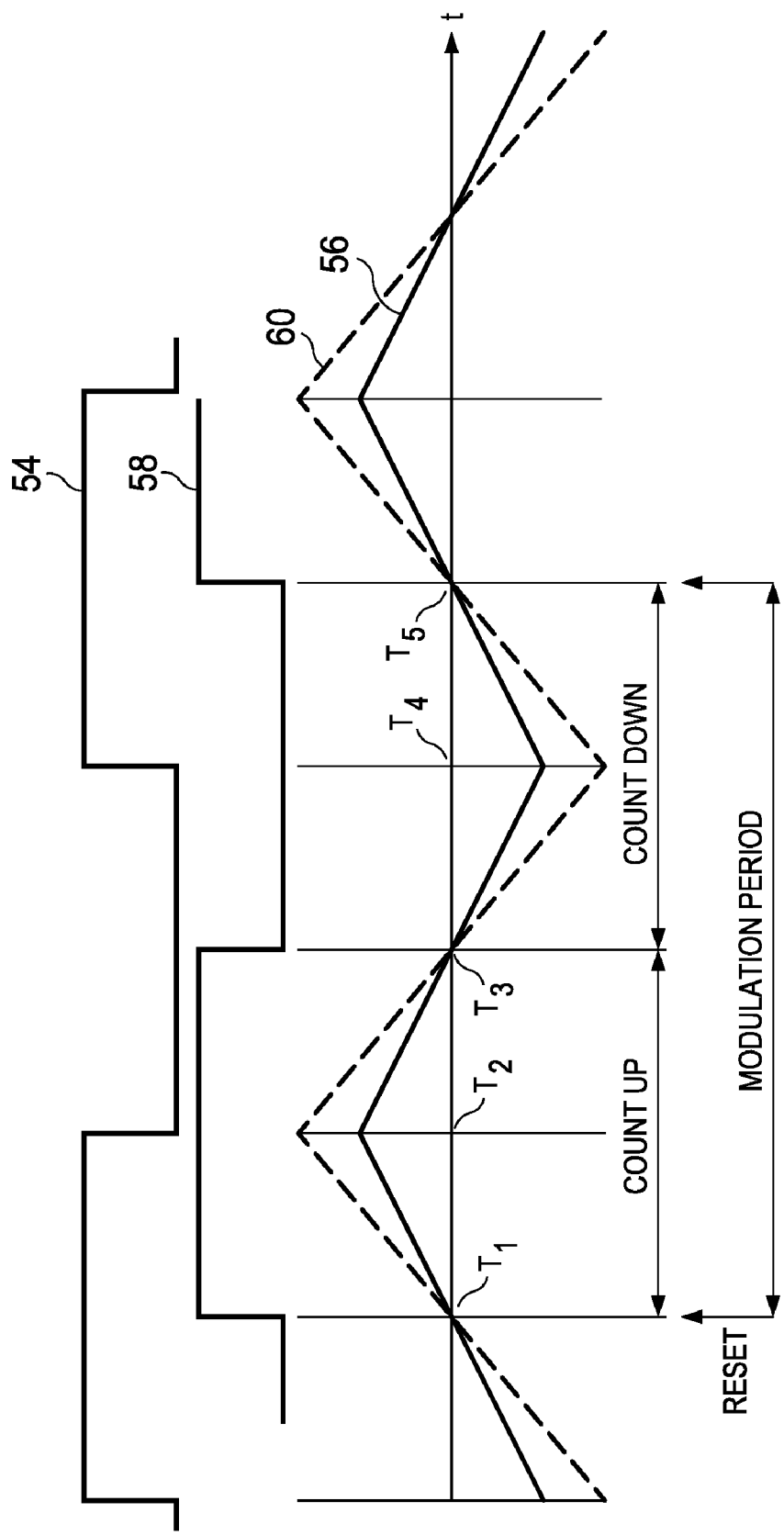
FIG. 4 shows the frequency variation over a modulation period.

The operation of the oscillating system 14 will now be described with reference to all FIGS. Oscillator 16 oscillates at a center frequency $F_c$. Clock unit 42 outputs at clock output 44 a clock signal which is represented in FIG. 3 by a line 54. Ramp generator 38 which receives clock signal 54 at its clock input 46 is clocked by the clock signal 54. Thus, a ramp signal 56 shown in FIG. 4 is output at ramp generator output 40 which follows the clock signal, i.e. there is an increasing ramp while the clock signal 54 is positive and a decreasing ramp while the clock signal 54 is negative. The ramp signal is a triangular ramp signal. Of course, the relationship may also be reversed with a decreasing ramp when the clock signal is high and an increasing ramp when the clock signal is low.

Clock unit 42 further outputs a clock signal 58 at its clock output 48 which is out of phase by 90° related to clock signal 54. FIG. 4 shows the relationship between clock signal 58 and clock signal 54. Clock signal 58 is fed into clock input 50 of counter 24. In the example embodiment counter 24 counts up while clock signal 58 is high and counts down while clock signal 58 is low. One time period of clock signal 54 or 58 corresponds to one modulation time period. Ramp signal 56 is output at signal output 40 and fed into modulation signal input 20 of oscillator 16.

Figure 1:
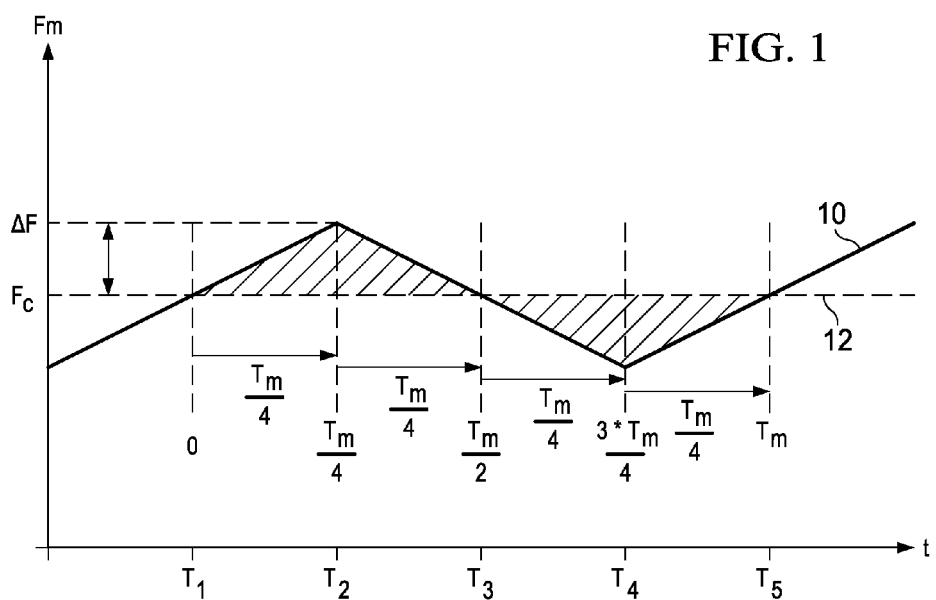
FIG. 1 shows a frequency-time diagram illustrating the integration over time of the modulated frequency.

The modulated frequency $F_m$ output over time at oscillator output 18 is shown as line 10 in FIG. 1. The frequency variation follows the modulation control ramp signal 56. Line 10 is of course idealized, because of the non-linear behavior of the oscillator, the amplitude, i.e. the maximum frequency deviation will vary and not follow linearly the ramp signal.

Counter 24 with its count input 22 connected to the frequency output of oscillator 16 counts every oscillator time period, thus measures the modulated frequency. Because clock signal 58 is phase shifted in relation to clock signal 54, the count-up period starts at a time T1 in the middle of an increasing ramp when the modulated oscillator frequency is equal the center frequency. During the whole count-up period the modulated oscillator frequency is greater than the center frequency. At a time T2, which is after a quarter of the modulation time period, clock signal 54 changes from high to low and modulation signal 56 starts a decreasing ramp. The modulated oscillator frequency is still higher than the center frequency and counter 24 still counts up as clock signal 58 is still high.

The count-down period starts at a time T3 when clock signal 58 clocking the counter 24 changes from high to low. This is in the middle of a decreasing ramp when the modulated oscillator frequency is again equal to the center frequency. The ramp of the modulation signal is still decreasing because at time T3 clock signal 54 is still low. At a time T4, which is after three quarters of a modulation time period, clock signal 54 changes from low to high and the ramp of the ramp generator starts to increase again. But counter 24 still counts down as clock signal 58 is still low. At a time T5 a full modulation period is completed and clock signal 58 becomes high stopping the count-down period. During the whole count-down period the modulated oscillator frequency is lower than the center frequency.

At time T5, i.e. after a full modulation period, counter 24 is reset and outputs at count output 26 a count result to comparator 30. There will always be a positive result, because during the count-up phase the modulated oscillator frequency is always higher than the center frequency and during the count-down phase the modulated oscillator frequency is always smaller than the center frequency. Counting up corresponds to an integration of the modulated oscillator frequency over time during the first half of the modulating time period $T_m$, while during the count-down phase the modulated oscillator frequency is integrated over time during the second half of the modulating time period $T_m$. Thus the count result is the difference between an integration of the modulated oscillator frequency over time during the first half of the modulating time period $T_m$ and an integration of the modulated oscillator frequency over time during the second half of the modulating time period $T_m$.

The difference R output at counter output 26 depends on the modulation index $M_I$ and on the ratio of the oscillator center frequency to the modulation frequency. Solving Formula (10) for R, we obtain $$R = \frac{T_m \cdot F_c \cdot M_I}{2} \qquad (11)$$

Assuming that a ratio N between the center frequency Fc of the oscillator and the modulating frequency $F_m$ is 64

$$N = \frac{F_c}{F_m} = 64 \qquad (12)$$

and with $$T_m = \frac{1}{F_m} \qquad (13)$$

and a modulation index $$M_I = 0.1 \qquad (14)$$

the result or the expected difference at the counter output would be $$R = \frac{64 * 0.1}{2} = 3.2 \qquad (15)$$

This expected difference is input to comparator 30 at input 32. This difference depends on the desired modulation index and on the ratio between center frequency and modulating frequency. It may be an integer or counting may be effectuated over several time periods and the result averaged before input to comparator 32.

The comparator is adapted to output three different signals at output 34. In the preferred embodiment the comparator 30 is a digital comparator. A first signal indicates that the calculated difference is smaller than the expected difference; a second signal indicates that the calculated difference is equal to the expected difference and a third signal that the calculated difference is greater than the expected difference. The comparator output signal is input to control input 36 of ramp generator 38. The first comparator signal, indicating that the calculated difference is smaller than expected, will lead to an increase of the amplitude of the ramp signal as indicated in FIG. 4 by a dotted line 60. The second signal will lead to no change, whereas the third comparator signal will decrease the amplitude of the ramp signal.

The changed ramp signal will lead to a change in the modulation of the oscillator frequency and thus to a change in the modulation index. Thus, the oscillating system 14 effectuates a frequency modulation index control.

While the invention has been described for a digital implementation, an analog implementation is also possible.

Although the present invention has been described in detail, it should be understood that various changes, substitutions and alterations can be made thereto without departing from the spirit and scope of the invention as defined by the appended claims.

The invention claimed is:

1. An electronic device for controlling a frequency modulation index comprising:
a frequency modulation index control loop having an input adapted to be connected to a frequency output of a frequency controllable oscillator having a center frequency Fc and an output adapted to be connected to an input of a frequency-modulation unit, the modulation index control loop being adapted to determine the modulation index, wherein the frequency modulation index control loop is adapted to measure the modulated frequency which is output from the controllable oscillator; and wherein the modulation index is calculated by an integration over time of the absolute value of deviation from the center frequency of the measured modulated frequency signal;
the frequency-modulation unit being adapted to output a modulation signal to the controllable oscillator for frequency-modulating the oscillator center frequency $F_c$ with a modulating frequency $F_m$ such that during a first half of the modulating time period $T_m$ the oscillator frequency is higher than the center frequency $F_c$ and during a second half of the modulating time period $T_m$ the oscillator frequency is lower than the center frequency $F_c$;
an integrating unit with an input adapted to be connected to an output of the controllable oscillator and adapted to calculate a difference between an integration of the modulated oscillator frequency over time during the first half of the modulating time period $T_m$ and an integration of the modulated oscillator frequency over time during the second half of the modulating time period $T_m$; and
a comparator unit coupled to an output of the integrating unit and adapted to compare the calculated difference with an expected difference and coupled to output a comparator signal to an input of the frequency-modulating unit to adjust the modulation signal output from the frequency-modulating unit accordingly to match the calculated difference with the expected difference.

2. The electronic device according to claim 1, wherein the frequency-modulating unit is a triangular signal generator outputting a triangular signal with a controllable amplitude which is adjustable by the comparator signal.

3. The electronic device according to claim 1, wherein the integrating unit is an up-down counter coupled to count up the periods of the modulated frequency during the first half of the modulating time period $T_m$ and to count down the periods of the modulated frequency during the second half of the modulating time period $T_m$.

4. The electronic device according to claim 3, wherein the up-down counter is reset at each beginning of a modulating time period $T_m$ and outputs to the comparator unit the actual count at each end of a modulating time period $T_m$.

5. The electronic device according to claim 4, wherein the comparator unit is a digital comparator adapted to output a first signal, when the calculated difference is smaller than the expected difference, a second signal, when the calculated difference is equal the expected difference, and a third signal, when the calculated difference is greater than the expected difference.

6. The electronic device according to claim 1, wherein the integrating unit is an analogue integrator.

7. The electronic device according to claim 6, wherein the comparator unit is an analogue comparator.

8. The electronic device according to claim 1, further comprising a clock unit providing a clock signal for the modulating frequency, the clock unit being coupled to the frequency-modulating unit and to the integrating unit, wherein the clock signal fed to the frequency-modulating unit is phase shifted by 90° to the clock signal fed to the integrating unit.

9. An oscillating system comprising an electronic device according to claim 1, wherein the controllable oscillator is self-oscillating DC-DC converter and the modulated frequency signal is adapted to vary a propagation delay self-oscillating DC-DC converter.

10. An oscillating system comprising an electronic device according to claim 1, wherein the controllable oscillator is a ring-oscillator and the modulated frequency signal is adapted to vary a propagation delay of the ring-oscillator.

11. A method of frequency-modulating with a modulation frequency $F_m$ a non-linear controllable oscillator having a center frequency $F_c$ with a constant modulation index, the method comprising:

provided a triangular ramp generator signal with a variable amplitude;

frequency-modulating the non-linear controllable oscillator using the triangular ramp generator signal such that during a first half of the modulating time period $T_m$ the oscillator frequency is higher than the center frequency $F_c$ and in a second half of the modulating time period $T_m$ the oscillator frequency is lower than the center frequency Fc;

measuring the modulated oscillator frequency which is output from the controllable oscillator;

integrating the measured modulated oscillator frequency over time during the first half of the modulating time period $T_m$ and integrate the modulated oscillator frequency over time during the second half of the modulating time period $T_m$; and calculating the difference between the result obtained during the first half of the modulating time period $T_m$ and the result obtained during the second half of the modulating time period $T_m$;

comparing the calculated difference with an expected difference; and adjusting the amplitude of the triangular ramp generator signal output from the frequency-modulating unit accordingly to match the calculated difference with the expected difference.

12. A self-oscillating DC-DC converter comprising:

a non-locked loop non-linear controllable oscillator having a center frequency Fc and having a modulation input for generating a spread spectrum signal;

a frequency modulation circuit for frequency modulating the output frequency of the controllable oscillator, such that during a first-half of a modulating time period the oscillator frequency is higher than the center frequency Fc and in a second half of the modulating time period, the oscillator frequency is lower than the center frequency Fc;

a frequency modulation index control loop adapted to measure the modulated frequency output from the controllable oscillator;

an integrating unit integrating the measured modulated oscillator frequency over time during the first half of the modulating time period and integrating the modulated oscillator frequency over time during the second half of the modulated time period; and a modulation index control circuit utilizing a difference between a value measured by the integrating unit during the first half of the modulating time period and the second half of the modulating time period to maintain a constant modulation index.

\* \* \* \* \*